United States Patent
Bonges, III et al.

(10) Patent No.: US 7,067,886 B2
(45) Date of Patent: Jun. 27, 2006

(54) METHOD OF ASSESSING POTENTIAL FOR CHARGING DAMAGE IN SOI DESIGNS AND STRUCTURES FOR ELIMINATING POTENTIAL FOR DAMAGE

(75) Inventors: Henry A. Bonges, III, Milton, VT (US); David L. Harmon, Essex Junction, VT (US); Terence B. Hook, Jericho, VT (US); Wing L. Lai, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 10/605,888

(22) Filed: Nov. 4, 2003

(65) Prior Publication Data

US 2005/0093072 A1 May 5, 2005

(51) Int. Cl.
*H01L 23/62* (2006.01)

(52) U.S. Cl. ............... 257/360; 257/356; 257/362

(58) Field of Classification Search ............ 257/356, 257/357, 359, 360, 361
See application file for complete search history.

(56) References Cited

U.S. PATENT DOCUMENTS

| | | | |
|---|---|---|---|
| 5,923,067 A * | 7/1999 | Voldman | ............... 257/349 |
| 5,994,742 A | 11/1999 | Krishnan et al. | |
| 5,998,299 A | 12/1999 | Krishnan | |
| 6,016,062 A | 1/2000 | Nicollian et al. | |
| 6,194,233 B1 | 2/2001 | Bedner et al. | |
| 6,207,996 B1 * | 3/2001 | Utsunomiya et al. | ....... 257/356 |
| 6,235,642 B1 | 5/2001 | Lee et al. | |
| 6,292,927 B1 | 9/2001 | Gopisetty et al. | |
| 6,414,358 B1 | 7/2002 | Lin et al. | |
| 6,417,544 B1 | 7/2002 | Jun et al. | |
| 6,441,397 B1 | 8/2002 | Yamamoto | |
| 6,448,599 B1 | 9/2002 | Wang | |
| 6,504,212 B1 * | 1/2003 | Allen et al. | ............... 257/347 |
| 6,566,716 B1 | 5/2003 | Lin et al. | |
| 2001/0006243 A1 * | 7/2001 | Morishita | ............... 257/360 |
| 2001/0028056 A1 | 10/2001 | Yamamoto | |
| 2001/0045667 A1 | 11/2001 | Yamamuchi et al. | |
| 2001/0046718 A1 | 11/2001 | Iranmanesh | |
| 2002/0000579 A1 | 1/2002 | Aoyama | |
| 2002/0031617 A1 | 3/2002 | Sumiya et al. | |
| 2002/0037651 A1 | 3/2002 | Lee | |
| 2002/0050617 A1 * | 5/2002 | Kato | ............... 257/360 |
| 2002/0063298 A1 | 5/2002 | Wang | |
| 2002/0096723 A1 * | 7/2002 | Awaka | ............... 257/360 |
| 2002/0142526 A1 | 10/2002 | Khare et al. | |
| 2002/0158348 A1 | 10/2002 | Petrucci et al. | |
| 2003/0027399 A1 | 2/2003 | Iranmanesh | |
| 2003/0068878 A1 | 4/2003 | Lin et al. | |
| 2003/0075762 A1 | 4/2003 | Lin et al. | |
| 2003/0114015 A1 | 6/2003 | Tokashiki | |

* cited by examiner

*Primary Examiner*—Ngân V. Ngô
(74) *Attorney, Agent, or Firm*—McGinn & Gibb, PLLC; Richard M. Kotulak, Esq.

(57) ABSTRACT

A method and structure alters an integrated circuit design having silicon over insulator (SOI) transistors. The method/structure prevents damage from charging during processing to the gate of SOI transistors by tracing electrical nets in the integrated circuit design, identifying SOI transistors that have a voltage differential between the source/drain and gate as potentially damaged SOI transistors (based on the tracing of the electrical nets), and connecting a shunt device across the source/drain and the gate of each of the potentially damaged SOI transistors. Alternatively, the method/structure provides for connecting compensating conductors through a series device.

15 Claims, 2 Drawing Sheets

METHOD OF ASSESSING POTENTIAL FOR CHARGING DAMAGE IN SOI DESIGNS AND STRUCTURES FOR ELIMINATING POTENTIAL FOR DAMAGE

BACKGROUND OF INVENTION

1. Field of the Invention

The present invention generally relates to protection circuitry and more particularly to a method and structure that includes a shunt device between the source/drain and gate of SOI transistors which may develop a voltage differential between the source/drain and gate during wafer fabrication. The shunt device eliminates the potential for charging damage from processing.

2. Description of Related Art

One problem that exists when designing integrated circuits with silicon-over-insulator (SOI) transistors relates to the detection of which SOI transistors may be susceptible to charging damage, and to providing protection once such a susceptible device is identified. In SOI it is not possible to "tie down" a floating gate in the traditional sense, such as by adding a diode connection to the substrate or nwell. SOI technologies are inherently less susceptible to charging damage because both the source/drain and the gate tend to have similar antennae, so the potential of both nodes varies together. This is not, however, certain in all cases. The invention described below is designed to detect and modify the integrated circuit design to eliminate the possibility of charging damage.

SUMMARY OF INVENTION

The invention provides a method of altering an integrated circuit design having silicon over insulator (SOI) transistors. The invention prevents damage from a potential difference between the source/drain and gate of SOI transistors by tracing electrical nets in the integrated circuit design, identifying SOI transistors that may have a voltage differential between the source/drain and gate as potentially damaged SOI transistors (based on the tracing of the electrical nets), and connecting a shunt device across the source/drain and the gate of each of the potentially damaged SOI transistors. In addition, the invention can also connect compensating antennae to each of the nodes to balance the charging and eliminate the potential for damage.

The shunt device and the compensating conductor eliminate the potential for charging damage to the gate-of each of the potentially damaged SOI transistors. The tracing process is performed assuming all metals and diffusions are conductive. The tracing, the identifying, and the connecting processes are repeated at each level of wiring within the integrated circuit design.

The invention compares aspect ratios of vias connected to the source/drain and the gate of each of the SOI transistors to determine whether a voltage differential might exist between the source/drain and the gate. Alternatively, the invention can compare chip locations of conductors connected to the source/drain and the gate of each of the SOI transistors to determine whether a voltage differential might exist between the source/drain and the gate. Also, the invention can compare parasitic capacitances of conductors connected to the source/drain and the gate of each of the SOI transistors to determine whether a voltage differential might exist between the source/drain and the gate.

The foregoing process produces a protection circuit for an integrated circuit device that includes silicon over insulator (SOI) transistors and has a shunt device connected from the source/drain to the gate of at least one of the SOI transistors. The structure can also include a compensating conductor connected to one or the other or both of the source/drain or gate of the susceptible device through a series device. The series device and the compensating conductor eliminate the potential for charging damage between the source/drain and the gate of the SOI transistor. Further, the shunt and the series devices perform no function other than eliminating the potential for charging damage. The shunt and series device could be, for example, an FET connected as a diode.

The shunt device should be positioned in parallel with the SOI transistor. Thus, the shunt device can be positioned between a first conductor connected to the source/drain of the SOI transistor and a second conductor connected to the gate of the SOI transistor. Alternatively, the series device can be positioned between a first conductor connected to the SOI transistor and a second conductor that is not connected to the SOI transistor. Also, the invention can further include a second shunt device, wherein the shunt device is connected to a first conductor and the second shunt device is connected to a second conductor, where the first conductor is connected to the source/drain of the SOI transistor and the second conductor is connected to the gate of the SOI transistor.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
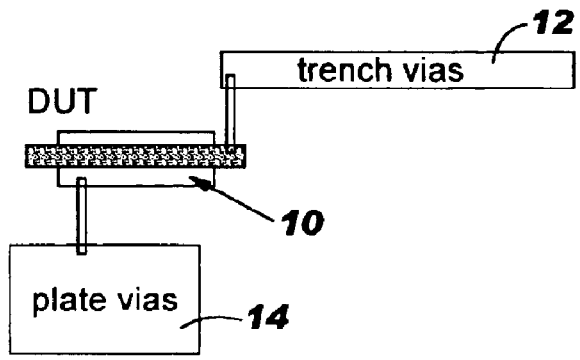
FIG. 1 is a schematic diagram of a SOI circuit.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

As mentioned above, even SOI design structures produce the possibility of charging damage. For example, it is possible to create a differential antenna by the arrangement of vias within the metal line. Vias placed in narrow metal lines have a larger aspect ratio than vias placed well within large metal plates, and may therefore charge to a different potential when exposed to a plasma. This occurs in either via-first or trough-first processes, although the specific sensitive process then varies. If the gate and source/drain have different via/metal configurations, then charging damage can occur.

To address this problem, the invention traces electrical nets assuming that metals and diffusions (even when they are cut by an FET gate) are conductive, determines the characteristics of the charge-collecting antennas on each node of each FET, assesses the potential for charging damage on each device. Where appropriate, a shunt device and/or a compensating antenna, perhaps connected through a series device, is placed to eliminate the potential for charging damage.

More specifically, the vias on each node (gate and source/drain) of each FET are categorized and counted. The source and drain of each transistor have the same potential during the processing. Therefore, the source and drain are considered synonymous in this application and are sometimes referred to herein as a single unit using the terminology "source/drain." The conductive connections to the gate and source/drain are identified as either a high-aspect ratio or low-aspect ratio via by examining their shapes and locations with respect to the edge of the metal wire. The effective net on each node is determined by considering all FETs to be conductive (this is a realistic assumption as there is large leakage from each source/drain to the floating well, particularly under the typical processing conditions of elevated temperature and in the presence of photons). If the two nodes are in fact on the same net (assuming conductive FETs) then the device is not considered to be subject to damage. The potential for charging damage is assessed by considering how different and how large the antennas on the two nodes are. If the possibility of damage is considered to be too large, then a shunt device may be inserted from gate to source/drain, the antenna on one or the other of the nodes may be redesigned to balance the charging, or an additional dummy antenna may be added to one or the other node to balance the design. The dummy antenna may be connected with an otherwise non-functional transistor as a "series device."

During processing, the ultimate circuit configuration is not complete, so at each level of wiring (M1, M2, etc.) the charging situation is re-assessed. The total number of nodes to be examined reduces as higher levels of wiring are considered, until there is effectively only one single node at the final wiring level. Various degrees of refinement are possible, depending on the specifics of the particular technology. For example, the damage may be observed to occur only on devices of a particular type, and in a particular configuration. One such example is that "thick" (>2 nm) pfets with high-aspect ratio vias on the gate node may be the only susceptible configuration, and all others may be safely ignored.

Figure 4:
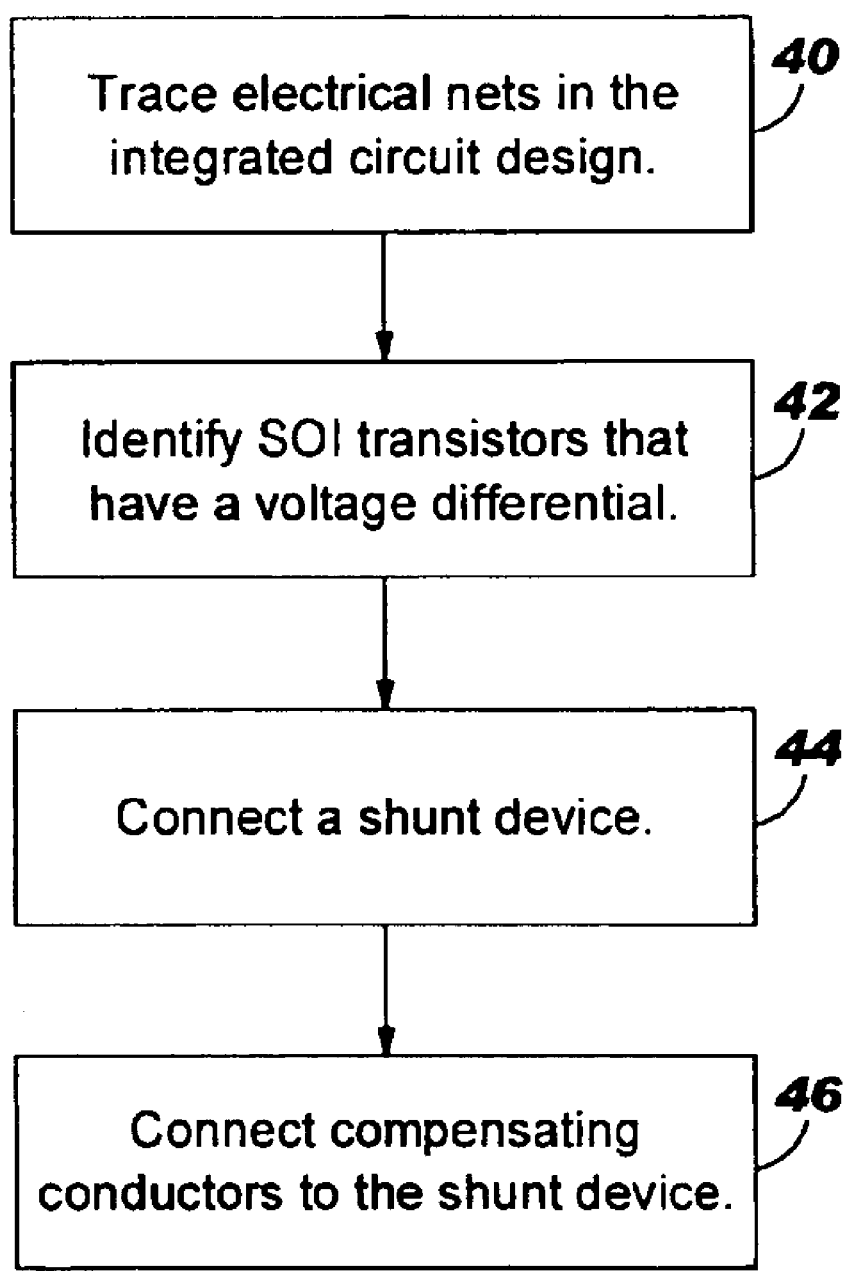
FIG. 4 is a flow diagram illustrating a method of the invention.

FIG. 4 shows of the invention in flowchart form. More specifically, FIG. 4 shows that the invention prevents damage from current flow between the source/drain and gate of SOI transistors by tracing electrical nets in the integrated circuit design 40, identifying SOI transistors that may have a voltage differential between the source/drain and gate as potentially damaged SOI transistors 42 (based on the tracing of the electrical nets), and connecting a shunt device to one of the source/drain and the gate of each of the potentially damaged SOI transistors 44. In addition, the invention can also connect compensating conductors to the potentially damaged transistor, possibly through series device 46. The series device and the compensating conductor eliminate the potential for charging damage between the source/drain and the gate of each of the potentially damaged SOI transistors. As mentioned above, the tracing process is performed assuming all metals and diffusions are conductive. Further, the tracing, the identifying, and the connecting processes are repeated at each level of wiring within the integrated circuit design.

The invention uses a number of different processes to determine whether a voltage differential may exist between the source/drain and gate of each SOI transistor. For example, the invention compares aspect ratios of vias connected to the source/drain and the gate of each of the SOI transistors to determine whether a voltage differential may exist between the source/drain and the gate. As mentioned above, the physical design of the conductive shapes that are connected to the gate and source/drain are compared to determine if such conductive shapes will act in similar manners as antennae with respect to charge accumulation. This can be accomplished using any conventional shapes processing program. Therefore, the invention obtains the length, width, height, etc. dimensions of the various conductors from the conventional shapes processing program and compares these different shapes. For example, a via embedded in a long thin metal wire will have different antenna characteristics than a via within a wide plate. If the shapes are not balanced, the charge accumulation is not likely to be balanced.

In addition, the invention can compare chip locations of conductors connected to the source/drain and the gate of each of the SOI transistors to determine whether a voltage differential may exist between the source/drain and the gate. Again, using any conventional integrated circuit model program the location, direction, length, etc. of the conductors connected to the gate and to the source/drain are compared to determine whether their different positions within the chip (or circuit) would cause a voltage differential. Further, the proximity of other conductive lines is considered by the invention. Therefore, other conductive lines that are within a predetermined proximity (and/or that carry a predetermined voltage level) will be considered to leak a certain predetermined percentage of the voltage to the conductor in question. Also, the invention can compare parasitic capacitances of conductors connected to the source/drain and the gate of each of the SOI transistors to determine whether a voltage differential may exist between the source/drain and the gate. Thus, the invention uses any conventional parasitic capacitance calculator to determine the parasitic capacitance of a conductor connected to the gate and compares this parasitic capacitance to a conductor connected to the source/drain.

Figure 2:
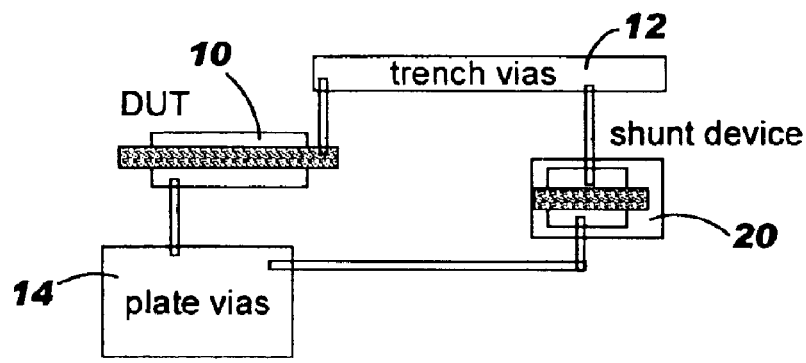
FIG. 2 is a schematic diagram of a SOI circuit with a shunt.

For example, FIG. 1 illustrates a potentially damaged SOI transistor 10 that has its gate connected to a plate via 14 and its source/drain connected to a trench via 12 (or vice versa). As mentioned above, the invention identifies this SOI transistor 10 as having the potential to be damaged because charge accumulation on the plate via 14 will be substantially different than the trench via 12 because the long narrow shape of the trench via-antenna 12 provides a greater antenna effect and will accumulate a more positive potential than will the plate via-antenna 14. As shown in FIG. 2, the invention adds a shunt device 20 connected to either the source/drain or gate. The shunt device is, for example, a diode-connected transistor that has its gate tied to its source.

Figure 3:
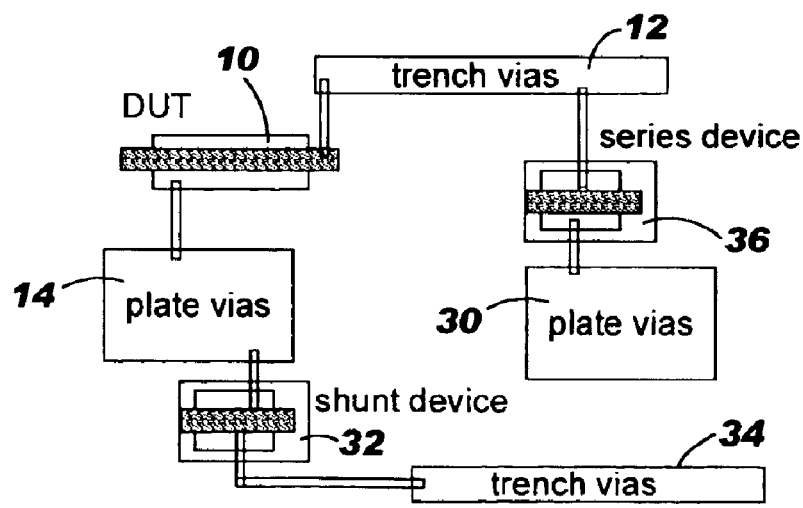
FIG. 3 is a schematic diagram of a SOI circuit with series devices.

The structure can also include a compensating conductor 30 connected through an additional series device 36 as shown in FIG. 3. Also, the invention can add more series devices 32 and potentially more conductive features 34, if needed, in order to balance the charging effects.

As shown in FIG. 2, the shunt device should be positioned in parallel with the SOI transistor. Thus, the shunt device can be positioned between a first conductor connected to the source/drain of the SOI transistor and a second conductor connected to the gate of the SOI transistor. Alternatively, a series device can be positioned between a first conductor connected to the SOI transistor and a second conductor (e.g., 30, 34) that is not connected to the SOI transistor. Also, the invention can further include additional series devices (e.g., 32, 36), wherein the first series device is connected to a first conductor and the second series device is connected to a second conductor, where the first conductor is connected to the source/drain of the SOI transistor and the second conductor is connected to the gate of the SOI transistor.

Once the susceptible devices are identified by the tracing program, the designer may choose the most appropriate means of eliminating the potential for damage. For example, a very large damage-susceptible device may be readily protected by the addition of a shunt device, where the additional leakage across the shunt device will not affect normal circuit operation. For locations where the leakage is unacceptable, a compensating antenna may be added. Additional capacitive load is the penalty for this approach. For locations where neither leakage nor capacitive load is acceptable to the normal circuit operation, connection of the compensating antenna through the series device is the best option.

The additional conductive features 30, 34 and series devices 32, 36 shown in FIG. 3 are merely exemplary devices added by the application. These examples primarily add the series devices and conductive features to balance the antenna affects due to via configuration differences. Series devices and conductive features may be added to compensate for other differences such as proximity of conductive lines, uneven positioning within the chip, etc. In addition, other devices such as large FETs can be added to compensate for other unbalances. including parasitic capacitance. The compensating devices and conductive shapes are added to the circuit to eliminate the potential for charging damage between the source/drain and the gate of the SOI transistor. Further, these devices and compensating structures perform no function other than eliminating the potential for charging damage. The invention provides rapid design flow from the checking algorithm and repair options provided, increased flexibility in choice of processes and tooling that might damage less robustly designed products, and improved reliability and yield in damage-free SOI products.

While the invention has been described in terms of preferred embodiments, those skilled in the art will recognize that the invention can be practiced with modification within the spirit and scope of the appended claims.

What is claimed is:

1. A protection circuit for an integrated circuit device that includes silicon over insulator (SOI) transistors, wherein said protection circuit comprises:
   a shunt connected to at least one of the source/drain and gate of at least one SOI transistor; and
   a compensating conductor connected to said shunt,
   wherein said shunt and said compensating conductor eliminate the potential for charging damage to the gate insulator of said SOI transistor, and
   wherein said shunt and said compensating conductor perform no function other than eliminating said potential for charging damage.

2. The circuit in claim 1, wherein said shunt device is positioned in parallel with said SOI transistor.

3. The circuit in claim 1, further comprising a series device in place of said shunt.

4. The circuit in claim 3, wherein said series device is positioned between a first conductor connected to said SOI transistor and a second conductor that is not connected to said SOI transistor.

5. The circuit in claim 3, further comprising a second series device, wherein said series device is connected to a first conductor and said second series device is connected to a second conductor, and
   wherein said first conductor is connected to said source/drain of said SOI transistor and said second conductor is connected to said gate of said SOI transistor.

6. A protection circuit for an integrated circuit device that includes silicon over insulator (SOI) transistors, wherein said protection circuit comprises:
   a series device connected to at least one of the source/drain and gate of at least one SOI transistor; and
   a compensating conductor connected to said series device,
   wherein said series device and said compensating conductor eliminate the potential for charging damage between said source/drain and said gate of said SOI transistor, and
   wherein said series device and said compensating conductor perform no function other than eliminating said potential for charging damage.

7. The circuit in claim 6, wherein said series device is positioned in parallel with said SOI transistor.

8. The circuit in claim 6, wherein said series device is positioned between a first conductor connected to said source/drain of said SOI transistor and a second conductor connected to said gate of said SOI transistor.

9. The circuit in claim 6, wherein said series device comprises a diode.

10. The circuit in claim 6, wherein said series device is positioned between a first conductor connected to said SOI transistor and a second conductor that is not connected to said SOI transistor.

11. The circuit in claim 6, further comprising a second series device, wherein said series device is connected to a first conductor and said second series device is connected to a second conductor, and
    wherein said first conductor is connected to said source/drain of said SOI transistor and said second conductor is connected to said gate of said SOI transistor.

12. A protection circuit for au integrated circuit device that includes silicon over insulator (SOI) transistors, wherein said protection circuit comprises;
    a shunt connected to at least one of the source/drain and gate of at least one SOI transistor; and
    a first compensating conductor connected to said shunt;
    a series device connected to at least one of the source/drain and gate of at least one SOI transistor, wherein said shunt and said series device are connected to different features of said at least one SOI transistor; and
    a second compensating conductor connected to said series device,
    wherein said shunt, said series device, said first compensating conductor, and said second compensating conductor eliminate the potential for charging damage to the gate insulator of said SOI transistor, and wherein said shunt, said series device, said first compensating conductor, and said second compensating conductor perform no function other than eliminating said potential for charging damage.

13. The circuit in claim 12, wherein said shunt device is positioned in parallel with said SOI transistor.

14. The circuit in claim 12, wherein said shunt device is positioned between a third conductor connected to said SOI transistor and said fist compensating conductor that is not connected to said SOI transistor.

15. The circuit in claim 12, wherein said series device is positioned between a third conductor connected to said SOI transistor and said second compensating conductor that is not connected to said SOI transistor.

* * * * *